United States Patent [19]

Conley et al.

[11] Patent Number: 5,008,579

[45] Date of Patent: Apr. 16, 1991

[54] LIGHT EMITTING POLYMER ELECTRICAL ENERGY SOURCE

[75] Inventors: Jerry J. Conley; Gary B. Mortensen, both of Waseca, Minn.

[73] Assignee: E. F. Johnson Co., Waseca, Minn.

[21] Appl. No.: 318,743

[22] Filed: Mar. 3, 1989

[51] Int. Cl.$^5$ .............................................. G21H 1/12
[52] U.S. Cl. ................................... 310/303; 310/302; 136/249; 136/253
[58] Field of Search ................ 310/302, 303; 136/249, 136/253; 357/30; 313/504

[56] References Cited

U.S. PATENT DOCUMENTS

| | | | |
|---|---|---|---|
| 2,847,585 | 8/1958 | Christian | 310/303 |
| 3,031,519 | 4/1962 | Silverman | |
| 3,033,797 | 5/1962 | DeLeo et al. | 252/301.1 |
| 3,053,927 | 9/1962 | Viszlocky | |
| 3,094,634 | 6/1963 | Rappaport | 310/303 |
| 3,304,445 | 2/1967 | Weddell et al. | |
| 3,325,420 | 6/1967 | Futterknecht | |
| 3,342,743 | 9/1967 | Rosenberg et al. | 252/301.1 |
| 3,483,040 | 12/1969 | Parkins | 136/89 |
| 3,740,273 | 6/1973 | Adler et al. | 136/202 |
| 3,767,947 | 10/1973 | Adler et al. | 310/30 |
| 3,939,366 | 2/1976 | Ato et al. | |
| 4,242,147 | 12/1980 | De Toia | 310/303 |
| 4,628,143 | 12/1986 | Brotz | 136/253 |
| 4,677,008 | 6/1987 | Webb | |
| 4,835,433 | 5/1989 | Brown | |

FOREIGN PATENT DOCUMENTS 615938 3/1961 Canada.
638106 5/1950 United Kingdom.

OTHER PUBLICATIONS

A. Van der Ziel, *Solid State Physical Electronics*, 1957 p. 390.
G. Foldiak, *Industrial Applications Radio Isotopes*, 1986, p. 387.
Yang, *Fundamentals of Semiconductor Devices*, 1978, pp. 147–162.

*Primary Examiner*—Nelson Moskowitz
*Attorney, Agent, or Firm*—Dorsey & Whitney

[57] ABSTRACT

An electrical energy source is created by the combination of a light emitting polymer material having at least one light emitting surface emitting light energy of a specified frequency bandwidth and a photovoltaic cell having a light collecting surface and a pair of electrical contacts. The light collecting surface of the photovoltaic cell is optically coupled with the light emitting surface of the light emitting polymer material. An open-circuit voltage is generated between the pair of electrical contacts as a result of the absorption of emitted light energy from the light emitting polymer material by the photovoltaic cell. In the preferred embodiment, the light emitting polymer is a tritiated organic polymer to which at least one organic phosphor or scintillant is bonded. Maximum absorption of the emitted light energy is achieved by the intimate optical contact between the light emitting surface and the light collecting surface, by matching the maximum absorption frequency bandwidth of the photovoltaic cell with the specified frequency bandwidth of the emitted light energy from the light emitting polymer material, and by the structural arrangement of the light emitting polymer material itself.

43 Claims, 6 Drawing Sheets

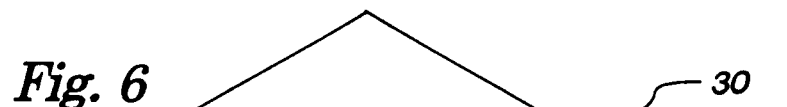
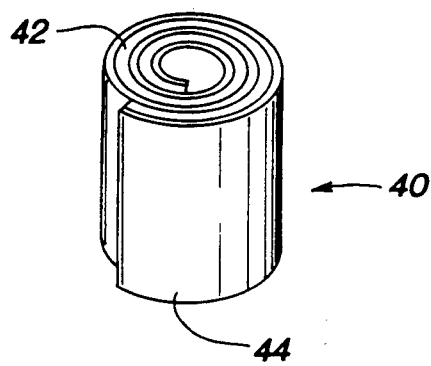
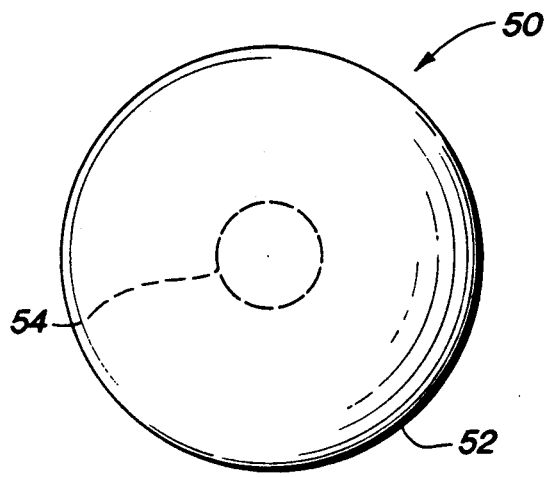

LIGHT EMITTING POLYMER ELECTRICAL ENERGY SOURCE

TECHNICAL FIELD

The present invention pertains to the generation of electrical energy through the combination of a light source and a photovoltaic cell. In particular, this invention pertains to a long-life, electrical energy source generated by the combination of a radioisotope activated polymer material emitting a low level of light with a photovoltaic cell arranged in intimate optical contact with the light emitting polymer material, the light emitting polymer in the preferred embodiment being comprised of a tritiated organic polymer to which an organic phosphor or scintillant is bonded.

BACKGROUND ART

Various types of energy sources consisting of photocells activated by some type of nuclear radiation are known in the prior art. These devices, sometimes referred to as "nuclear batteries" or "atomic batteries", convert nuclear electromagnetic radiation into electrical energy by one of two methods, single conversion systems or double conversion systems. Single conversion nuclear batteries generate electrical energy by converting the nuclear radiation (i.e. alpha particles, beta particles or gamma radiation) into electrical energy by direct absorption of the nuclear radiation at the p-n junction of a semiconductor material, for example, U.S. Pat. Nos. 3,094,634 and 3,304,445. Double conversion nuclear batteries generate electrical energy by converting the nuclear radiation into electromagnetic radiation, usually by irradiating a phosphorescent material that will generate light in the visible spectrum, and then converting that electromagnetic radiation into electrical energy by absorbtion of the electromagnetic radiation at the p-n junction of a semiconductor material, usually a typical photovoltaic cell, for example, U.S. Pat. Nos. 3,031,519, 3,053,927, and 3,483,040.

While the concept of a nuclear battery is not new, a practical and commercially feasible device of this type has not been possible because of the extreme dangers involved in the handling and use of radioactive materials. Most nuclear batteries of the type known in the prior art have either been unsafe or have required such extensive shielding of the nuclear material used to power the battery that the device is rendered impractical for most applications. The regulatory standards for radiation leakage upon container failure impose additional constraints that limit the applications for such devices. One possible means of overcoming these safety limitations is to limit the amount of radioactive material used in such a device. For example, in a typical smoke detector a small amount of radioactive foil containing one microcurie of radioactive Americium 241 is used to power the detection circuit of the device. In general, regulatory standards allow for small amounts of radioactive material to be used under certain circumstances. For example, with proper shielding and packaging, a device containing 5 curies of radioactive material may be approved by the Nuclear Regulatory Commission for limited commerical activities. These low limits on radioactive material effectively limit the radiation energy, and hence, the electrical energy that may be generated from any such source.

Using the amount of radioactivity as measured in curies, the total amount of power available from such an energy source can be calculated. Each curie of radioactive material will produce $3.7 \times 10^{10}$ Beqerels (decays)/second. Assuming that the radioactive emission is in the form of a beta particle from the radioisotope tritium having an average 5.6 KeV of energy, the total theoretical power emitted is 32.5 microwatts/curie. Theoretically, if there were a complete conversion of all of the power of this nuclear radiation to electrical energy, the total amount of power available from a small, but safe, amount of radioactive material containing less than 25 curies of tritium would be less than 1 milliwatt. Though the total amount of power generated by such a device over the half life of the tritium radioactive material may be on the order of a hundred watt-hours, until recently relatively few applications could operate with a continuous power supply outputting in the microwatt range. With the advent of CMOS and other low power circuitry, however, applications and uses for this type of long-life, low-watthour power supply are now becoming more practical.

Although a variety of self-luminous, low light sources have been available for a long time (e.g. radium and tritium activated phosphors used for creating self-luminous paints for watch dials, etc., U.S. Pat. Nos. 3,033,797, 3,325,420 and 3,342,743), it has generally been regarded that such materials were unsuitable for commercial use for the conversion of light into electricity. The low levels of radioactivity associated with such materials, though generally not harmful or dangerous, do not provide an adequate source of power for the nuclear batteries of the type known in the prior art. In addition to the low light level (50 micro-lamberts or less), such sources may also be characterized by rapid and unpredictable light decay and, in the case of radium-activated light sources, may produce undesirable radiation hazards associated with their decay products.

Though the concept of a long-life, electrical energy source activated by a radioactive material is attractive and has many potential applications none of the prior art devices have been able to create a safe, yet sufficiently powerful, energy source that is commercially feasible. Accordingly, there is a continuing need to develop a safe and practical long-life, electrical energy source powered by a radioactive source.

SUMMARY OF THE INVENTION

In accordance with the present invention, an electrical energy source is created by the combination of a light emitting polymer material having at least one light emitting surface emitting light energy of a specified frequency bandwidth and a photovaltaic cell having a light collecting surface and a pair of electrical contacts. The light collecting surface of the photovoltaic cell is optically coupled with the light emitting surface of the light emitting polymer material. An open-circuit voltage is generated between the pair of electrical contacts as a result of the absorption of emitted light energy from the light emitting polymer material by the photovoltaic cell.

In the preferred embodiment of the present invention, the light emitting polymer is a tritiated organic polymer to which at least one organic phosphor or scintillant is bonded. Maximum absorption of the emitted light energy is achieved by the intimate optical contact between the light emitting surface and the light collecting surface, by matching the maximum absorption frequency bandwidth of the photovoltaic cell with the specified frequency bandwidth of the emitted light energy from the light emitting polymer material, and by the structural arrangement of the light emitting polymer material itself. To maximize the surface area between the light emitting polymer and the photovoltaic cell, the light emitting surface and the light collecting surface are preferably arranged so that they are generally parallel to and in intimate contact with each other. In addition, the light emitting polymer material and the photovoltaic cell may be arranged to allow the photovoltaic cell to be constructed in manner so as to absorb light energy at more than a single surface.

In another embodiment of the present invention, the light emitting polymer material is optically separated from the photovoltaic cell by an optical control means for controlling the amount of light that may pass through the optical control means to be absorbed by the photovoltaic cell. The optical control means may be a liquid crystal display (LCD) or lead lantium zirconium titinate (PZLT) or similar material that is either transparent or opaque, depending upon the voltage or current applied to the material. By controlling the amount of light that may be absorbed by the photovoltaic cell, the optical control means also controls the output of the photovoltaic cell and, hence, operates as either a voltage or current regulator, depending upon the particular circuit that utilizes the electrical energy source of the present invention. The optical control means allows the electrical energy source of the present invention to simulate an alternating current source from a direct current source without the need for electrical circuitry external to the electrical energy source.

The present invention provides a novel radioisotope-activated, electrical energy source that exhibits several desirable characteristics. Foremost, the electrical energy source of the present invention is relatively safe and is, thus, viable for general commercial use when the quantities of radioactivity are generally below 100 curies. The low emissivity and high energy density of the preferred embodiment utilizing a tritiated organic polymer to which an organic phosphor or scintillant is bonded enable the electrical energy source to realistically utilize 4.0% or more of the theoretical 3.6 amp-hours of electrical energy that are present in each curie of tritium. In this embodiment, an electrical energy source having 100 curies of tritium is capable of providing 1 microwatt of power at 1 volt and 1 microamp for the entire lifetime of the electrical energy source, approximately 20 years.

Because the electrical energy generated by the present invention is dependent upon the rate of emission of photons from the light emitting polymer (which is in turn dependent upon the rate of beta-emissions from the radioisotope used to activate the light emitting polymer), the amount of energy available is constant and determinable. In addition to providing a unique source of electrical energy for CMOS, NMOS and other low power types of electronic circuitry, the output stability of the electrical energy source of the present invention makes it ideally suited for applications that require a very constant source of power and ensure that it is not drained of its energy if subjected to a short-circuit. Moreover, the materials and packaging of the present invention can be selected to enable the electrical energy source to operate in a cryogenic environment without significant degradation of the power compared to conventional chemical batteries, because the rate of conversion of the photons by the photovoltaic cell is positively affected by decreasing temperature.

Although light emitting polymers have been available for a number of years for various uses (primarily as self-luminescent paints), it is not known to use such light emitting polymers to power electrical energy sources. The present invention has discovered their usefulness for this purpose and, more importantly, the adaptability of light emitting polymers as compared to other prior art radioisotope vehicles to permit the design of electrical energy sources with greater efficiency and safety than in prior art devices.

Accordingly, a primary objective of the present invention is to provide a safe, yet sufficiently powerful, long-life, radioisotope-powered electrical energy source that is commercially feasible.

Another objective of the present invention is to provide a long-life source of electrical energy by the combination of a radioisotope-activated, light emitting polymer and a photovoltaic cell.

A further objective of the present invention is to provide an electrical energy source wherein the conversion efficiency by a photovoltaic cell of light emitted by a light emitting polymer is maximized.

An additional objective of the present invention is to provide an electrical energy source that includes an optical control means for controlling the amount of electrical energy generated by controlling the amount of light that is received by the photovoltaic cell from a light source.

A still further objective of the present invention is to provide a long-life, electrical energy source that provides a consistent power output by generating electrical energy at a constant watt-hour rate.

These and other objectives of the present invention will become apparent with reference to the drawings, the detailed description of the preferred embodiment and the appended claims.

DESCRIPTION OF THE DRAWINGS

FIG. 6 is a pictorial view showing a multiple-layer configuration of an alternative embodiment of the present invention arranged to allow for dual-sided utilization of the photovoltaic cells.

FIG. 7 is a pictorial view of an alternative embodiment of the present invention showing the light emitting polymer and the photovoltaic cell in spiral jelly-roll configuration.

FIG. 8 is a pictorial view of an alternative embodiment of the present invention showing the light emitting polymer cast about the photovoltaic cell in a spherical arrangement.

DESCRIPTION OF THE PREFERRED EMBODIMENTS

The present invention is directed to a safe and practical, long-life, electrical energy source made by the combination of a light emitting polymer, activated by a radioisotope source, with a photovoltaic cell, to produce electrical energy. As will be appreciated, the potential variations of such a combination are numerous. The practical feasibility of an electrical energy source in accordance with the present invention depends upon a number of considerations, including: (a) the choice of a suitable long-lived radioisotope, (b) the efficiency of the scintillation process in the polymer, (c) the efficiency of the photovoltaic cell, (d) radiation damage to the polymer and the photovoltaic cell, (e) the optical mating of the polymer and the photovoltaic cell, and (f) the geometry of the polymer and the photovoltaic cell. Each of these considerations will be discussed in describing the preferred embodiment of the present invention. It will be observed that the use of a light emitting polymer provides an opportunity to effectively design a safe and practical, long-life electrical energy source in response to these considerations.

Figure 1:
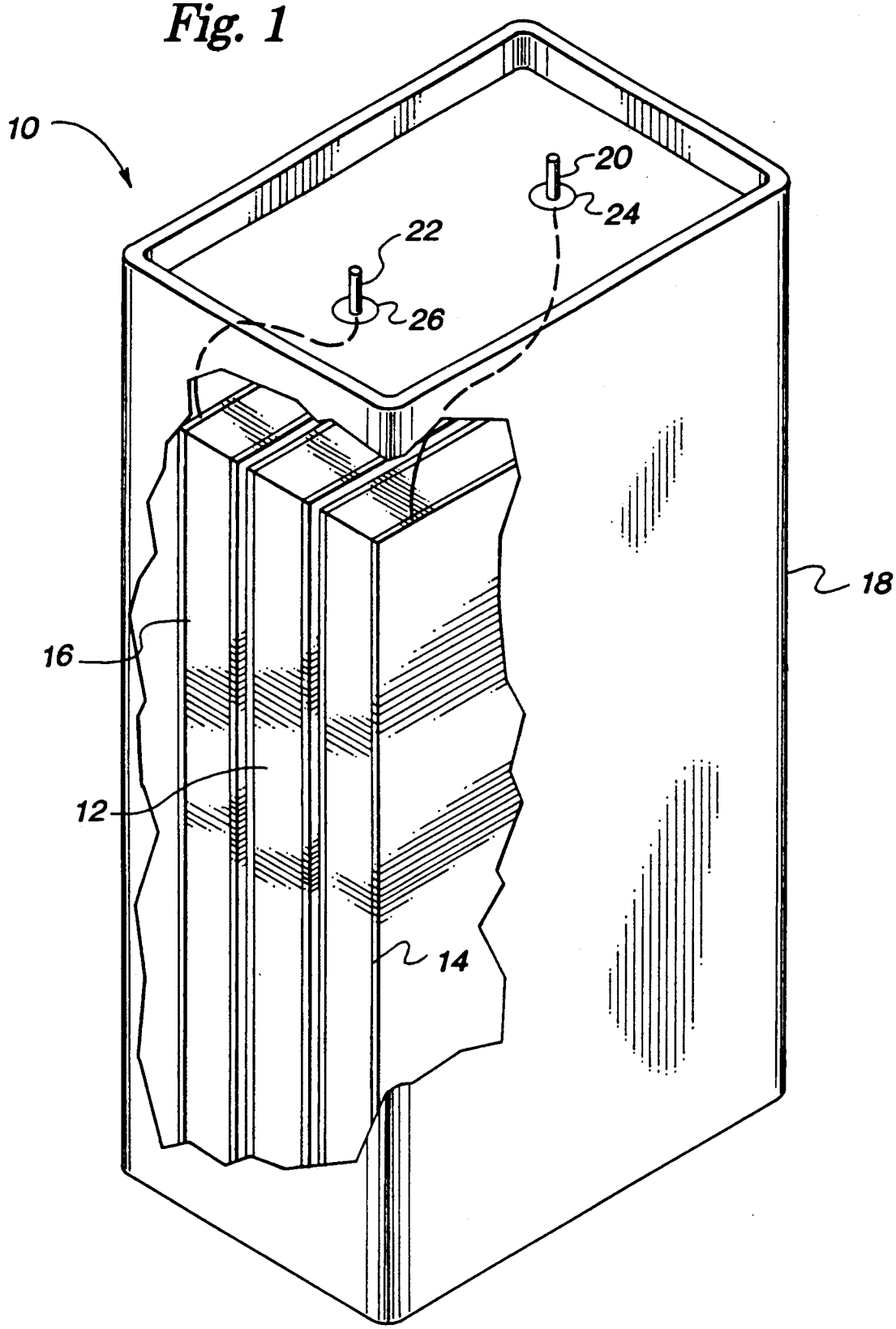
FIG. 1 is a cut-away pictorial view of a light emitting polymer electrical energy source in accordance with the preferred embodiment of the present invention.

Referring now to FIG. 1, a cut-away pictorial representation of the preferred embodiment of the present invention is shown. The electrical energy source 10 is comprised of a planar sheet of light emitting polymer ("LEP") material 12 that is interposed between a pair of photovoltaic cells 14 and 16 having planar dimensions similar to the LEP material 12. The photovoltaic cells 14 and 16 the LEP material 12 are encased in a sealed case 18, preferably a laser-welded, stainless steel case, having a pair of electrical contacts 20 and 22 exposed on one end of the case 18. The contacts 20 and 22 are disposed in a pair of ceramic insulators 24 and 26 and are connected to the photovoltaic cells 14 and 16 in such a manner that connected to the photovoltaic cells 14 and 16 in such a manner that one of the contacts will provide a positive voltage potential and the other contact will provide a negative voltage potential.

In the preferred embodiment, the LEP material 12 is a tritiated organic polymer to which an organic phosphor or scintillant is bonded. Such an LEP material was obtained from Amersham International plc, Amersham Place, Little Chalfont, Buckinghamshire, England, and pending NRC regulatory approval, may be available from Amersham International plc. It should be recognized that other types of LEP material known in the prior art may also be utilized with the present invention. (e.g., U.S. Pat. Nos. 3,033,797, 3,325,420 and 3,342,743). Those aspects of the LEP material 12 that allow it to be used effectively in the present invention are discussed below in connection with the various design considerations set forth above.

In the preferred embodiment, the photovoltaic cells 14 and 16 are amorphous thin-film silicon solar cells, Model No. 035-01581-01, available from ARCO Solar, Inc., Chatsworth, Calif., or their equivalent. These cells have their highest efficiency conversion (greater than 20%) in the blue range of the spectrum of visible light to match the frequency bandwidth of the emitted light of LEP material incorporating a phosphor that emits in the blue range. While the particular photovoltaic cells 14 and 16 in the preferred embodiment have been selected to match the blue range of the spectrum of visible light, it should be apparent that other photovoltaic cells may be selected to match the bandwidth of light emitted at other frequencies. In particular, as discussed below, it is known that a new solar cell, known as the Sunceram II (trademark), available from Panasonic's Industrial Battery Sales Div., is claimed to more efficient than conventional amorphous silicon solar cells, especially in the red range of the spectrum of visible light.

To maximize the optical transfer between the LEP material 12 and the photovoltaic cells 14 and 16, the surfaces of the photovoltaic cells 14 and 16 not in contact with the LEP material 12 are coated with a reflective material, preferably an aluminum paint or equivalent. The edges of the LEP material 12 not in contact with the photovoltaic cells 14 and 16 are clad with a similar reflective material. The surfaces of the LEP material 12 and the photovoltaic cells 14 and 16 that abut one another are coated with a contact gel, Rheogel 210C., available from Synthetic Technology Corp., McLain, Va., or its equivalent, as a means for optically coupling the surfaces to increase the amount of light that is transmitted from the LEP material 12 to the photovoltaic cells 14 and 16.

SELECTION OF THE RADIOISOTOPE

The radioisotope that is used in the LEP material 12 must produce sufficient scintillations in the LEP material to insure an adequate production of light for absorption by the photovoltaic cells 14 and 16. For safety purposes, it is desirable that the selected radioisotope be chemically bonded to the polymer. By chemically bonding the radioisotope to the polymer, any undesirable build-up of the radioisotope is prevented and the concentration levels of the radioisotope will remain constant no matter what environmental factors the LEP material 12 is subjected to. Unlike radioisotopes in a liquid or gaseous state, the bonding of the radioisotope to the polymer in the LEP material 12 of the present invention prevents the free release of radiation if the material or container is ever broken. The bonding of the radioisotope to the organic polymer is expected to result in NRC approval for the use of higher allowable levels of radioactive material for radioisotopes in this format.

The radioisotope should have a half-life comparable to the desired useful lifetime of the electrical energy source 10. Because the power is directly proportional to the rate of decay of the radioisotope in the LEP material 12, for a given desired power output the rate of decay should ideally correspond to the power requirements of the electrical energy source 10. If the half-life is too long with respect to the useful life of the electrical energy source 10, then the amount of radioisotope required to produce the same rate of decay is increased, thus presenting increased safety and shielding problems. If the half-life is too short with respect to the useful life of the electrical energy source 10, then the amount of radioisotope required to produce the desired rate of decay at the end of the useful life of the electrical energy source requires that the LEP material 12 be overloaded initially, thus generating wasted energy at the beginning of the life of the device. Obviously, if a decaying power source is desired or acceptable this consideration is not important.

To minimize the radiation hazards associated with use of a radioisotope, the radiation emitted by the selected radioisotope should not be very penetrating. Preferably, a high percentage of the radiation emitted by the radioisotope should be absorbed by the photovoltaic cells 14 and 16 or by the sealed case 18. Therefore, radioisotopes emitting gamma radiation or high-energy x-rays are not preferred; beta radiation emitters are preferred. In addition, the radioisotope must be selected so that it may be chemically bonded to the organic polymer to achieve the desired solid, captured state for the LEP material 12. A further consideration in selecting the radioisotope is the economic cost of the radioisotope. The cost of producing various radioisotopes varies by orders of magnitude. For example, the cost per curie of $^{14}C$ is more than two orders of magnitude greater than for $^3H$.

Table I provides data on several radioisotopes, among others, that may be used with the electrical energy source 10 of the present invention.

TABLE I

| Radioisotope | $^3H$ | $^{14}C$ | $^{10}Be$ | $^{32}Si$ | $^{32}P$ |
|---|---|---|---|---|---|
| Half-life (years) | 12.3 | 5730 | $2.7 \times 10^6$ | 650 | .039 |
| Max. beta Energy (MeV) | .0186 | .156 | .555 | .22 | 1.71 |
| Ave. beta Energy (MeV) | .0056 | .049 | .194 | .065 | .68 |
| Mass of 1 curie (grams) | $1.0 \times 10^{-4}$ | .22 | 75 | .058 | NA |
| Absorber to stop beats (mg/cm$^2$) | .72 | 24 | 180 | 30 | 790 |
| Power Density (mW/g) | 320 | 1.3 | .015 |  | 76 |

For the safety reasons mentioned above, beta-active radioisotopes are especially preferred in practicing the present invention. The decay of beta-active isotopes results in a continuum of beta energies being emitted from the radioisotope. This continuum extends from zero up to a maximum value as shown in Table I. The average beta energy is computed using the equation:

$$<E> = 0.099E(1-Z^{0.5})(3+E^{0.6})$$

where $<E>$ is the average energy in MeV, E is the maximum energy in MeV, and Z is the atomic number of the daughter nucleus that results after the decay. The first three radioisotopes in Table I decay to stable elements, but $^{32}Si$ decays to $^{32}P$, which in turn decays to stable sulphur. Therefore, the decay for each $^{32}Si$ atom produces the combined beta energy of the decay of both the silicon and the phosphorous.

One curie is defined to be $3.7 \times 10^{10}$ decays/second. The mass of the radioisotope required to produce this activity is obtained from the following equation:

$$m = 2.8 \times 10^{-6}(T_{\frac{1}{2}})M$$

where $T_{\frac{1}{2}}$ is the half-life of the radioisotope expressed in years and M is the atomic mass.

Because the radioisotope is an internal component of the polymer, a given thickness of shielding must be provided around the radioisotope-activated polymer to completely absorb all of the beta radiation. The following range relation was used to compute the required absorber thickness in Table I:

$$R = (540E - 130(1-e^{-4E}))$$

where R is in mg/cm$^2$ and E, the maximum beta energy, is in MeV. In order to obtain the linear thickness required by the absorber to shield all beta radiation, one would divide R by the density of the absorber. For example, if a polymer of 2 g/cm$^3$ is used as the absorber surrounding the LEP material 12, then the required thickness for $^3H$ would be 0.0036 mm.

Based upon the considerations set forth above and especially for safety reasons, the preferred radioisotope for the present invention is tritium. With a halflife of 12.36 years and a beta decay with an 0.0186 MeV maximum energy, tritium has been considered one of the most innocuous of fission produced radioisotopes. Because of the low energy and penetration power of the beta particle associated with its decay, tritium does not pose a significant external radiation hazard. The beta particles emitted by tritium are not even capable of penetrating the epidermis. In addition, the chemical bonding of the tritium in the solid polymer form prevents escape of the tritium in its gaseous state, thereby decreasing the chance that tritium may be absorbed into the body by skin penetration in the form of a gas or vapor.

Another method to compare the various radioisotopes is to compare their relative power densities, the decay power produced per gram of material. With the greatest power density/gram and the least amount of absorbent material necessary to stop all beta particles from being emitted, tritium is the best choice for an electrical energy source that provides a low power, long-life electrical energy source when the requirements of a single electrical energy source are less than 5 to 10 milliwatts-hours for the desired lifetime of the electrical energy source, approximately 20 years or less.

It will be seen that if a higher power output or longer lifetime of the electrical energy source is required, other radioisotopes may be utilized in the light emitting polymer, depending upon the environmental and safety considerations involved. The next most favorable radioisotope may be the $^{32}Si$ and $^{32}P$ combination, although the shielding requirements for this radioisotope would be significantly increased. Because silicon is similar to carbon, it should be readily incorporated into the polymer. Although $^{14}C$ also appears to be a good candidate for use as the radioisotope, it should be recognized that the long half-life will require about 250 times as much $^{14}C$ in the polymer as compared to $^3H$ to produce the same power. For example, in a military or space application, $^{14}C$ or the $^{32}Si$ and $^{32}P$ combination may be preferred because of the higher energy of the beta particles and because of the significantly longer half-life, provided that adequate shielding can be incorporated into the packaging of the electrical energy source to compensate for the higher energy radiation and the increased curie level required by the longer half-life radioisotopes.

SCINTILLATION EFFICIENCIES

As a beta particle generated by the selected radioisotope moves through the organic polymer, energy is released by several mechanisms: (a) excitation of $\pi$-electrons to excited states, (b) $\pi$-electron ionization, (c) excitation of other electrons to excited states, and (d) ionization of other electrons. All but the first of these mechanisms ultimately only result in an increased thermal energy within the LEP material 12. Only the first results in scintillation, the release of a photon from the organic phosphor or scintillant upon decay from the excited state. For many organic materials, this occurs with a probability of about 10%. Therefore, only about 10-20% of the energy deposited by a beta particle is available for light production. Because it may be necessary to shift the light produced by such scintillations into the portion of the spectrum to which the photovoltaic cells 14 and 16 are more sensitive, secondary and tertiary phosphors may also need to be added to the LEP material 12. This may result in further degradation of the scintillation efficiency of the LEP material 12. For a more detailed explanation of the operation of scintillators in response to beta radiation, reference is made to E. Schrafm, *Organic Scintillator Detectors*, 1973, pp. 67-74, which is hereby incorporated by reference herein.

In the LEP material 12 of the preferred embodiment, the scintillation efficiency is increased by bringing the primary organic phosphor into a weak bonding with the tritiated organic polymer. Because the beta particle emitted by the tritium is of such low energy, the closer the tritium is located to the phosphor, the greater the probability that the beta particle will be able to interact with the phosphor. Because the average mean distance of the path of an emitted beta particle is less than 1 micron, the probabilities of interaction between the beta particle and the phosphor decrease dramatically unless the phosphor is located within that range.

In the preferred embodiment, the LEP material 12 utilizes both a primary and a secondary phosphor. The primary organic phosphor may be any phosphor or scintillant in the groups PPO, PBD, or POPOP that operates to capture the beta particle and emit a photon in the ultraviolet frequency. The secondary phosphor may either be bonded to or admixed with the organic polymer and performs a Stokes shift on the emitted photon to shift its frequency to the desired frequency of the light to be emitted by the LEP material 12. The various techniques for performing a Stokes shift are well known in the art.

Unlike the prior art techniques of admixing the tritium with the phosphor or encapsulating gaseous tritium in a glass vessel, the LEP material 12 utilized by the present invention maximizes the scintillation efficiency of the beta particle and the organic phosphor by positing the tritium relatively near the primary phosphor and by arranging the LEP material 12 such that it is generally optically transparent at the desired frequency of the emitted light. In addition, to minimize any optical blockage of photons emitted by the LEP material 12, it desirable that the catalysts for bonding both the radioisotope and the phosphor or scintillant be completely removed or disappear after the polymerization process.

Figure 2:
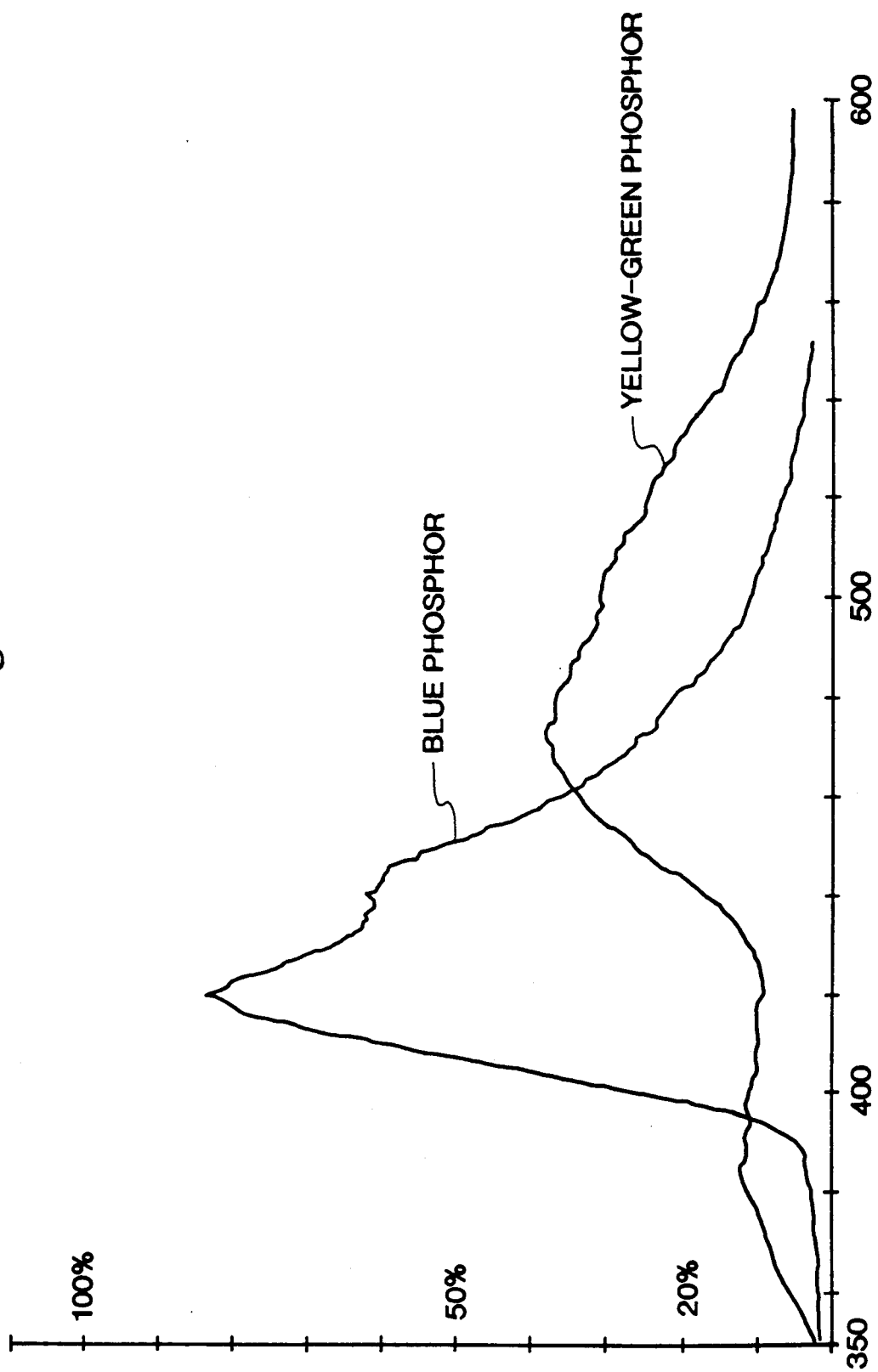
FIG. 2 is a graph showing the spectral emissions of a various phosphors used as scintillators in the light emitting polymer.
Figure 3:
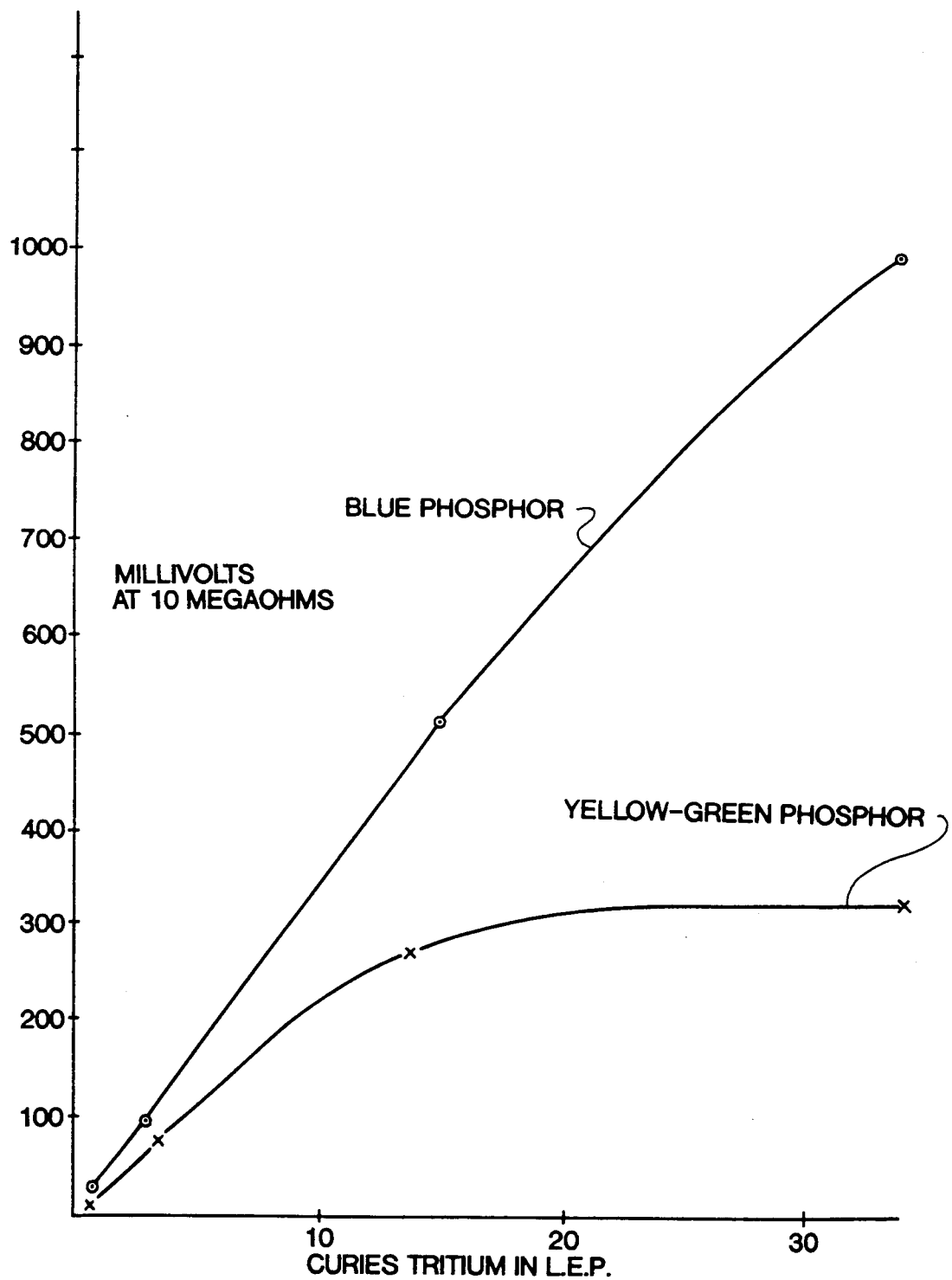
FIG. 3 is a graph showing the relative scintillation efficiencies for each of the phosphors shown in FIG. 2.

Referring now to FIG. 2, the spectral emissions of a blue phosphor and a yellow-green phosphor used as the secondary phosphor in the LEP material 12 are shown. FIG. 3 shows the relative scintillation efficiencies as a function of output voltages over various curie levels in the LEP material 12 utilizing each of these phosphors. As can be seen, the relative efficiency of the yellow-green phosphor decreases with increasing levels of the radioisotope. This effect, known as bleaching, is well known in the field of scintillation. Obviously, it is desirable that the phosphor(s) selected for use with the LEP material 12 should not be subject to bleaching or other types of deterioration as a result of activation by the particular radioisotope selected for use in the LEP material 12.

It should be noted that although the preferred embodiments are described in terms of scintillants that emit energy in the visible spectrum, it is also possible to use a scintillant that emits electromagnetic energy in the ultraviolet, infrared, or other frequency bands of the electromagnetic spectrum. accordingly, the term "light" as used in this application is intended to encompass all frequencies of electromagnetic radiation produced by scintillation activity. For example, if the average mean path of a photon emitted in the ultraviolet spectrum by the primary phosphor is sufficiently great to escape the polymer, and if a photovoltaic cell capable of absorbing energy having a wavelength of 400 nm or less were available, the LEP material 12 might not need a secondary phosphor and the energy emitted by the primary phosphor could be used directly to power the photovoltaic cells 14 and 16. In addition, the bandwidth of the emitted light from the LEP material 12 need not be limited to monochromatic light. Various combinations of primary and/or secondary phosphors in the LEP material could be used to broaden the bandwidth of either or both the intermediary or emitted energy from the LEP material 12. Again, the polymer structure of the LEP material allows the LEP material 12 to be designed to achieve these objectives.

PHOTOVOLTAIC CELL EFFICIENCIES

Figure 4:
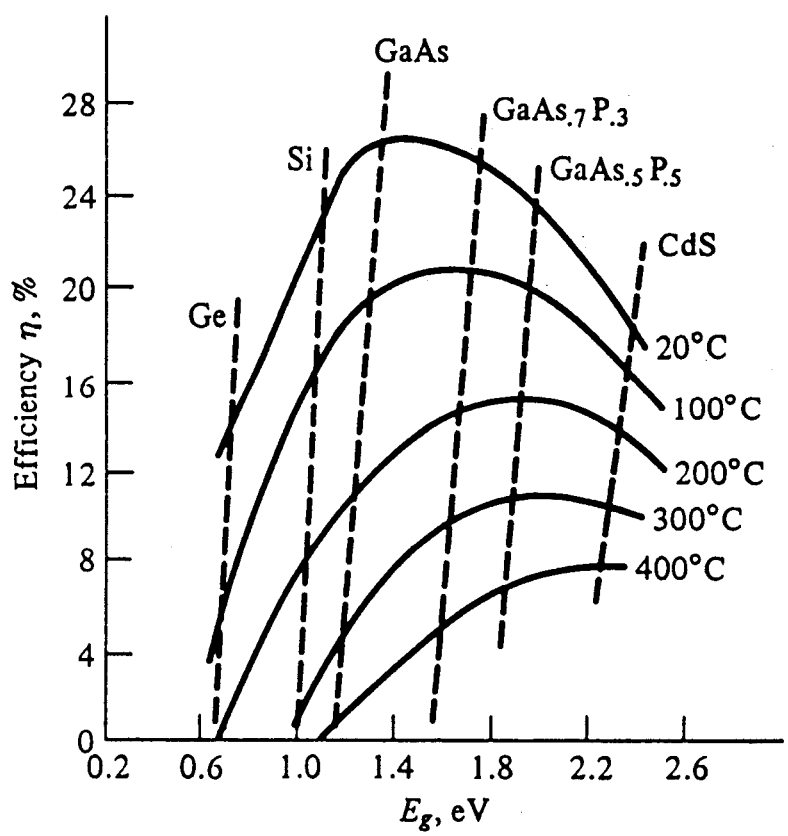
FIG. 4 is a graph showing the maximum theoretical conversion efficiencies for various semiconductor materials.

Presently, most of the work, both theoretical and practical, on the design of semiconductor photovoltaic cells relates to their use as solar cells that are designed to absorb all of the spectral energy available from the sun, either at AM0 conditions outside the earth's atmosphere, or at AM1 conditions at sea level. It is well known that there are both theoretical and practical efficiency limits for such solar cells. In theory, there are only two parameters that will determine the efficiency of a solar cell, the band gap energy of the solar cell material and the temperature of the cell. For an amorphous silicon solar cell, the bandgap energy of 1.1 eV means that only those photons of wavelengths less than about 1,100 nm are capable of producing electron-hole pairs in the photovoltaic cells that will result in the generation of electrical energy; the remaining energy is lost, usually in the form of heat. Referring now to FIG. 4, the maximum theoretical conversion efficiencies for a variety of photovoltaic cell materials are shown as a function of temperature and energy gap.

In practice, there are a number of other factors that limit the conversion efficiency of solar cells, including the excess energy loss for photons that are within the band gap energy, the fill factor loss and the voltage loss as a result of the mismatch of the impedance of the load and the source. The net result is that typical solar cell efficiencies of only 20% are generally achievable to date. Recently, greater efficiencies have been achieved for a printed compound thin-film photovoltaic cell utilizing the group II-VI compound semiconductors CdS/CdTe. These solar cells, known as the Sunceram II, are available from Panasonic's Industrial Battery Sales Div., Secaucus, N.J., and utilize an n-layer (CdS) and a p-layer (CdTe) semiconductor films created by a film-fabrications process that entails paste application by screen printing and sintering in a belt-type furnace. The Sunceram II solar cells have an output five times higher than conventional amorphous silicon solar cells when illuminated by tungsten light.

Figure 5:
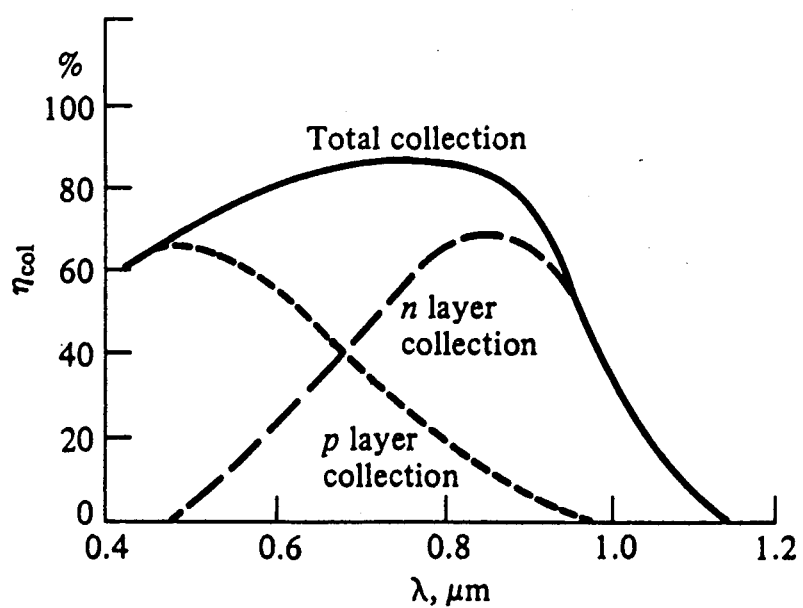
FIG. 5 is a graph showing the collection efficiency of a photovoltaic cell as a function of the wavelength of the incident light.

In the present invention, the design parameters of the photovoltaic cell do not have to be matched to the entire bandwidth of visible light to optimize absorption of the entire solar spectrum. Rather, the design of the photovoltaic cells 14 and 16 may be tailored to the particular bandwidth and wavelengths of emitted light from the LEP material 12. It is well known that different semiconductor materials have different bandgap energies and, hence, will absorb photons of different wavelengths (e.g., Si absorbs photons with $\lambda < 1.1$ $\mu$m and GaAs absorbs photons with $\lambda < 0.9$ $\mu$m). However, the wavelength of the photon also determines where in the p-n junction the photons will be converted into electron-hole pairs. For short wavelengths ($\lambda = 0.55$ $\mu$m), most photons will be converted into electron-hole pairs in a narrow region near the surface of the p-layer of the p-n junction. Whereas, at longer wavelengths ($\lambda = 0.9$ $\mu$m), the absorption coefficient for the semiconductor is small and absorption takes place mostly in the n-layer of the p-n junction. FIG. 5 shows the collection efficiency for both the p-layer and the n-layer of a photovoltaic cell as a function of the wavelength of the incident light. The collection efficiency of the photovoltaic cell will be influenced by the minority-carrier diffusion length of the semiconductor material and by the absorption coefficient. A large absorption coefficient leads to heavy absorption near the surface of the p-n junction, resulting in strong collection in the skin layer. A small absorption coefficient allows deep penetration of photons so the base layer of the p-n junction becomes more important in carrier collection. A typical GaAs photovoltaic cell produces more of the skin layer effect, and a typical Si photovoltaic cell produces more of the base layer effect. For a more detailed discussion as to the effect of wavelength and semiconductor selection on the conversion efficiencies of the photovoltaic cell, reference is made to Edward S. Yang, *Fundamentals of Semiconductor Devices*, pp. 147-162 (1978).

In the present invention, the selection of the primary and secondary phosphors of the LEP material 12 can be made to generate a monochromatic or a narrow bandwidth of emitted light, the frequency of which can be matched to the particular type of photovoltaic cell 14 and 16 desired. This matching depends upon the type of conversion desired (base vs. skin effect), the efficiency of the semiconductor material in the bandwidth, and other considerations relating to the design of the electrical energy source 10, including the curie loading, safety factors, the cost, and the environment in which the device will be operated. Although such a device is not currently available, it may be possible to provide a double-sided, monochromatic, bandwidth-matched photovoltaic cell for use with light emitting polymer in the present invention that could achieve conversion efficiencies of 60-70% or higher.

POLYMER AND PHOTOVOLTAIC CELL RADIATION DAMAGE

The long term performance of a polymer scintillator can be affected by the accumulated radiation dose deposited in the polymer. In addition, a variety of other factors can affect the aging of the polymer. The major variable in pure polymer aging are: (a) radiation intensity and wavelength distribution; (b) ambient temperature; (c) monomer content; (d) level of other impurities; and (e) oxygen concentration in the surrounding atmosphere. To increase the life of the polymer, the last four factors should all be minimized. For the LEP material 12, four additional factors affect the stability and aging of the polymer: (f) radiation resistance and purity of the scintillators used; (g) wavelength of the emitted light (the higher the better); (h) presence of multiple tritium labelled molecules (the lower the better), and (i) radioactive concentration level of the polymer. The basic polymer of the LEP material 12 of the preferred embodiment is known to have one of the lowest coefficients of radiation damage of any polymer.

As for the photovoltaic cells, it is well known that radiation energies in excess of 4 KeV can damage the p-n junction in the semiconductor material. If the single conversion process taught by the prior art were used to produce electrical energy, the damage to one cm$^2$ of a p-n junction caused by the beta particles emitted by a one curie of tritium would effectively destroy the p-n junction in a relatively short amount of time. In addition, if a single conversion process were used, the polymer containing the tritium could be no more than 1 micron thick, otherwise the polymer itself would prevent the beta particles from reaching the p-n junction. The present invention allows a double conversion process to be used with a low-level light source and still achieve a conversion efficiency that is equal to or greater than the conversion efficiencies achieved by single conversion processes. By efficiently converting the beta particles to photons in the LEP material 12, the present invention simultaneously solves the problems of radiation damage and the distance that the p-n junction can be located from the energy source. An additional advantage of utilizing the LEP material 12 of the present invention is that the LEP material 12 itself shields the p-n junction of the semiconductor material of the photovoltaic cells 14 and 16 from radiation damage, thereby increasing the useful life of the electrical energy source 10.

OPTICAL MATING CONSIDERATIONS

To maximize the transfer of light emitted by the LEP material 12, the LEP material 12 must be efficiently coupled to the photovoltaic cells 14 and 16. This is achieved by the use of a means for optically coupling the LEP material 12 with the photovoltaic cells 14 and 16 and by creating smooth surfaces on both the LEP material 12 and the photovoltaic cells 14 and 16.

The primary purpose of the means for optically coupling the LEP material 12 and the photovoltaic cells 14 and 16 is to insure that as much of the light that is emitted by the LEP material 12 will be allowed to pass through to the light collecting surface of the photovoltaic cells 14 and 16. Unlike prior art devices, the means for optically coupling the two materials is not required to also serve as a means for isolating the two materials. In one embodiment, an anti-reflective coating matched to the frequency of the emitted light and the indices of refraction of the two materials is used as the means for optically coupling the two materials. Where the index of refraction of the polymer is $n_p$ and the index of refraction of the photovoltaic cell is $n_c$, then the index of refraction of the anti-reflective coating should be the:

$$n_r = (n_p n_c)^{0.5}$$

The index of refraction of silicon is about 3.5 and the index of refraction for most polymers is around 1.5. Thus, the anti-reflective coating should have an index of refraction of about 2.3. The thickness of the anti-reflective coating should be $\frac{1}{4}$ wavelength of the frequency of the emitted light. A similar effect may also be achieved by the use of an optical coupling gel, such as Rheogel 210C. or its equivalent. As with the geometrical considerations to be discussed below, the effect on efficiency of the means for optically coupling the two materials may vary depending upon the materials selected and the manner of their construction.

The light emitting surface of the LEP material 12 and the light collecting surfaces of the photovoltaic cells 14 and 16 should be as smooth as possible to aid in the transmission of light between the two. The existence of a rough interface between the two surfaces will alter the angles of incidence of the various light rays emitted by the LEP material 12 and could allow some of the light rays to be reflected back into the polymer, thereby lengthening their optical path and reducing the probability that they will be re-reflected back into the photovoltaic cells 14 and 16.

It should also be noted that the use of optical concentrators in the optical mating between the LEP material 12 and the photovoltaic cells 14 and 16 could also be used to increase the optical efficiency of the conversion process.

GEOMETRICAL CONSIDERATIONS

The preferred method of constructing the LEP material 12 and the photovoltaic cells 14 and 16 is in the planar format shown in FIG. 1. In terms of optical efficiency, the geometrical shape of the LEP material 12 and the photovoltaic cells 14 and 16 will determine, to a certain extent, how much of the emitted light is actually received by the photovoltaic cells 14 and 16. In the planar embodiment shown in FIG. 1, there is a loss of emitted light from the edges of the LEP material 12 not in contact with the photovoltaic cells 14 and 16. For a sheet of LEP material 12 having dimensions of 42 mm×13 mm×0.5 mm, there would be a loss of emitted light of approximately 5% due to the optical aperture of $\phi_{critical}$ along the edges of the LEP material 12. This can be demonstrated by calculating the optimum numerical aperture based upon the indices of refraction for each material using Snell's law. This loss can be minimized by cladding the edges of the LEP material with a reflective coating in a manner similar to that known in the fiber optic field; however, the cladding will not achieve the optimum total internal reflection and some of the energy may be still absorbed or lost through the edges of the LEP material 12. Another advantage of the planar embodiment of the present invention is in maximizing the relative amount of surface area available between the LEP material 12 and the photovoltaic cells 14 and 16. The amount of power output available from the photovoltaic cells 14 and 16 is a direct function of the total surface area available for the light collecting surface. In addition, if the thickness of the LEP material is kept small, 0.5 mm, the average mean path of the photons emitted is not consumed by the thickness of the LEP material itself.

In an alternative embodiment shown in FIG. 6, the LEP material 32 is arranged with a double-sided photovoltaic cell 34 in a multiple-layered configuration. In this embodiment the efficiency of the electrical energy source 30 is increased because the emitted light may be absorbed by more than a single photovoltaic cell. In addition, the photovoltaic cell 34 is capable of receiving light from both sides, as well as any light that may have passed through adjacent photovoltaic cells. The photovoltaic cell 34 could be a photovoltaic laminate, for example, constructed of a first semiconductor layer, a first conductive substrate layer, a dielectric isolation layer, a second conductive substrate layer, and a second semiconductor layer. Using the screening technique referred to above for the Sunceram II, the photovoltaic cell 34 might also be constructed as a three-part photovoltaic laminate comprising: semiconductor, dielectric, and semiconductor, with the conductive layer being overlayed by a screening process.

In another embodiment shown in FIG. 7, the LEP material 42 is arranged with a double-sided photovoltaic cell 44 in a jelly-roll spiral configuration. In this embodiment the efficiency of the electrical energy source 40 is increased because of the minimum amount of edge surface relative to the light emitting and light absorbing surfaces of the LEP material 42 and the photovoltaic cell 44. One possible photovoltaic cell for this embodiment may be a new flexible photoelectric material developed by 3M, Minneapolis, Minn., in connection with the center for Amorphous Semiconductors at Iowa State University, Ames, Iowa. The top and bottom of the electrical energy source 40 may also be provided with circular photovoltaic cells (not shown) to further increase the efficiency by capturing any emitted light from the edges of the LEP material 42.

In still another embodiment shown in FIG. 8, the LEP material 52 acts both as the light source for the photovoltaic cell 54 and the structural support for the electrical energy source 50. In this embodiment, the LEP material 52 is cast in the form of a sphere surrounding the photovoltaic cell 54. The photovoltaic cell 54 would also preferably be in the form of a sphere having a screened conductor around the periphery of the sphere. The LEP material 52 could be coated with a reflective material, such as aluminum, thereby insuring total internal reflection of all of the emitted light from the LEP material 52. Each of these spherical cells could be encased in an inactive polymer structure that would serve as the shielding and support for multiple cells for the electrical energy source 50.

It will be apparent that the use of the LEP material 12 as the carrier for the selected radioisotope provides the present invention with numerous advantages in terms of the geometrical and design considerations for constructing the electrical energy source 10. Although only a limited number of possible design combinations of the LEP material 12 and the photovoltaic cells 14 and 16 (or single photovoltaic cell or double-sided photovoltaic cell) have been presented, it should be appreciated that many other designs will be possible because of the nature of the LEP material 12.

OPTICAL CONTROL MEANS

Figure 9:
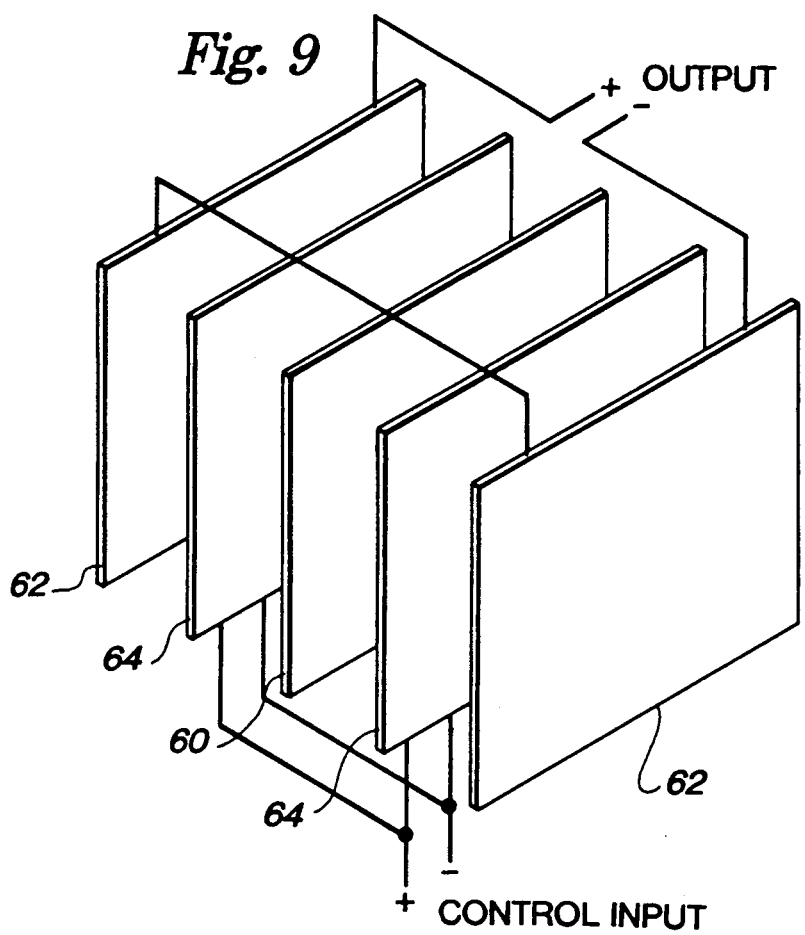
FIG. 9 is a shcematic view showing another alternative embodiment of the present invention including an optical control means.
Figure 10:
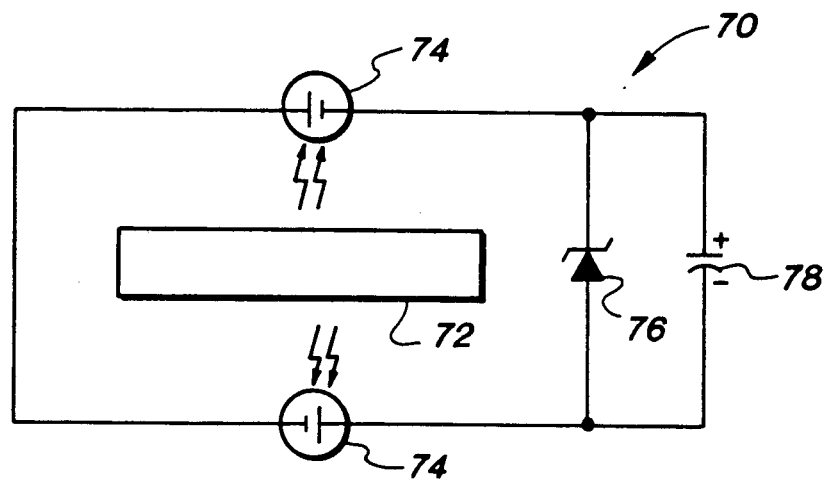
FIG. 10 is a circuit diagram of the electrical energy source of the present invention showing the addition of other circuit elements.

In still another embodiment of the present invention shown in FIGS. 9 and 10, the LEP material 60 is optically separated from the photovoltaic cells 62 by an optical control means 64 for controlling the amount of light that may be absorbed by the photovoltaic cells 62. The optical control means 64 may be a liquid crystal display (LCD) or lead lantium zirconium titinate (PZLT) or similar material that is either transparent or opaque, depending upon the voltage or current applied to the material. By controlling the amount of light that may be absorbed by the photovoltaic cells 62, the optical control means 64 also controls the output of the photovoltaic cells 62 and, hence, operates as either a voltage or current regulator depending upon the particular circuit that utilizes the electrical energy source of the present invention. The inclusion of the optical control means 64 allows the electrical energy source of the present invention to simulate an alternating current source from a direct current source without the need for any electrical circuitry external to the electrical energy source.

It will be readily apparent that other circuit elements may be incorporated with the electrical energy source 10 of the present invention to optimize the electrical energy source for a particular application. As shown in FIG. 10, a zener diode 76 has been added to establish a fixed voltage level for the output of the electrical energy source 70 having LEP material 72 emitting light energy to be aborbed by the photovoltaic cells 74. A capacitor 78 has also been added to act as an internal electrical storage device that would be charged up to a predetermined voltage level over a given time period and then utilized to power the desired circuit for a relatively shorter time period, after which the electrical energy source 70 would recharge the capacitor 74 for the next demand period. In this way, the large amp-hour power of the electrical energy source 70 may be realized in applications where an intermittent power demand is required, but the demand is higher than the steady state power (either current or voltage) supplied by the electrical energy source 70. For example, if the electrical energy source 70 were used to power a telemetry detection/transmission circuit, such a circuit could be designed to have the detection portion run off the steady state power of the electrical energy source, with the transmission portion of the circuit powered for short durations by the capacitor 74.

ELECTRICAL CONSIDERATIONS

Not only is the electrical energy source 10 of the present invention unique as a battery because of its relatively long-life, other electrical characteristics of the electrical energy source 10 of the present invention make it particularly well-suited for certain applications. Based upon the test data reported in Tables II and III below, the internal impedance of the the electrical energy sources in accordance with the present invention is calculated at approximately 5M Ohms. This high impedance is particularly desirable for low-power applications, such as CMOS and NMOS devices. Because the impedance of the load is easily matched to the impedance of the source, it is easier to achieve the maximum output from the electrical energy source of the present invention. The nature of the source of the electrical energy of the present invention, namely a generally constant rate of radioactive decay, allows the electrical energy source 10 to be short circuited without causing any damage to the device and, more importantly, without affecting the power available in the device at some time in the future. Unlike low-power chemical batteries, the electrical energy source of the present invention does not release all of its "stored" energy when it is short circuited. This means that there is no risk of explosion or damage to the device as a result of the short circuit. Also, when the short circuit is removed from the electrical energy source 10, the output of the device is immediately restored to its pre-short state. This allows the electrical energy source 10 to easily act as an ideal constant voltage source, even after the source has been short circuited.

SAMPLE RESULTS

The following tables set forth the measured voltage output of the circuit shown in FIG. 10 having a single electrical energy source in accordance with the present invention and utilizing both the blue and yellow-green phosphors for various curie levels. The LEP material was placed in intimate physical and optical contact with a single specially calibrated photovoltaic cell Model No. 035-015817-01, available from ARCO Solar, Inc., having dimensions of 38×17 mm. The measured voltages are measured in millivolts in parallel with a 10M ohm input impedence of the volt meter used to take the measurements:

TABLE II

| | | Blue Phosphor | | | |
|---|---|---|---|---|---|
| Dimensions Total curies | (mm) | 1 Ci/g 45 × 15 × 1 0.62 | 5 Ci/g 41 × 15 × 1 2.7 | 25 Ci/g 47 × 15 × 1 15 | 50 Ci/g 48 × 15 × 1 34 |
| Load (ohms) | 1K | 0.00 | 0.05 | 0.15 | 0.3 |
| | 4.7K | 0.1 | 0.1 | 0.7 | 1.3 |
| | 10K | 0.1 | 0.2 | 1.3 | 2.6 |
| | 22K | 0.2 | 0.6 | 3.0 | 6.1 |
| | 47K | 0.3 | 1.1 | 5.8 | 2.0 |
| | 68K | 0.5 | 1.6 | 8.8 | 18.1 |
| | 100K | 0.75 | 2.4 | 13.1 | 27.1 |
| | 150K | 1.05 | 3.5 | 18.7 | 38.6 |
| | 220K | 1.5 | 4.9 | 26.6 | 54.7 |
| | 330K | 2.3 | 7.9 | 42.7 | 88.3 |
| | 470K | 3.0 | 10.1 | 54.7 | 112.7 |
| | 680K | 4.6 | 15.4 | 83.4 | 171.6 |
| | 1M | 5.9 | 19.8 | 107.1 | 220 |
| | 2.2M | 11.4 | 38.3 | 206 | 421 |
| | 4.7M | 20.4 | 68.3 | 365 | 727 |
| | 10M | 29.4 | 97.9 | 516 | 984 |
| | | Output Voltages (millivolts) | | | |

TABLE III

| | | Yellow-Green Phosphor | | | |
|---|---|---|---|---|---|
| Dimensions Total curies | (mm) | 1 Ci/g 35 × 15 × 1 0.46 | 5 Ci/g 47 × 15 × 1 2.83 | 25 Ci/g 55 × 15 × 1 13.7 | 50 Ci/g 49 × 15 × 1 31.6 |
| Load (ohms) | 1K | 0.00 | 0.0 | 0.1 | 0.1 |
| | 4.7K | 0.00 | 0.1 | 0.3 | 0.4 |
| | 10K | 0.0 | 0.2 | 0.7 | 0.8 |
| | 22K | 0.1 | 0.5 | 1.6 | 1.9 |

TABLE III-continued

| | | Yellow-Green Phosphor | | | |
|---|---|---|---|---|---|
| | | 1 Ci/g | 5 Ci/g | 25 Ci/g | 50 Ci/g |
| Dimensions | | 35 × 15 × 1 | 47 × 15 × 1 | 55 × 15 × 1 | 49 × 15 × 1 |
| Total curies | (mm) | 0.46 | 2.83 | 13.7 | 31.6 |
| 47K | | 0.2 | 0.8 | 3.1 | 3.8 |
| 68K | | 0.2 | 1.3 | 4.6 | 5.7 |
| 100K | | 0.3 | 1.9 | 6.9 | 8.4 |
| 150K | | 0.45 | 2.7 | 9.9 | 12.1 |
| 220K | | 0.65 | 3.8 | 14.0 | 17.1 |
| 330K | | 1.05 | 6.1 | 22.5 | 27.6 |
| 470K | | 1.25 | 7.9 | 28.7 | 35.2 |
| 680K | | 2.0 | 12.1 | 43.8 | 53.7 |
| 1M | | 2.5 | 15.5 | 56.3 | 68.9 |
| 2.2M | | 4.9 | 29.9 | 108.4 | 132.5 |
| 4.7M | | 8.7 | 52.9 | 190.7 | 233 |
| 10M | | 12.4 | 75.9 | 271.0 | 330 |
| | | Output Voltages (millivolts) | | | |

Although the description of the preferred embodiment has been presented, it is contemplated that various changes could be made without deviating from the spirit of the present invention. Accordingly, it is intended that the scope of the present invention be dictated by the appended claims rather than by the description of the preferred embodiment.

We claim:

1. An electrical energy source, comprising:
   a light emitting polymer material having at least one light emitting surface emitting light energy in a specified frequency bandwidth, the light emitting polymer material comprising an organic polymer incorporating a radioisotope emitting beta particles to which an organic phosphor is bonded, wherein the radioisotope consists of a radioisotope selected from the group $^3H$, $^{10}Be$, $^{14}C$, $^{32}Si$ and $^{32}P$; and
   a photovoltaic cell having a light collecting surface and a pair of electrical contacts, the light collecting surface of the photovoltaic cell being substantially intimately optically coupled to the light emitting surface of the light emitting polymer, such that an open-circuit voltage is generated between the pair of electrical contacts as a result of the photovoltaic cell's absorption of light energy emitted from the light emitting polymer.

2. The electrical energy source of claim 1 wherein the light emitting polymer material is comprised of a tritiated organic polymer to which an organic phosphor is bonded.

3. The electrical energy source of claim 2 wherein the organic phosphor is comprised of a primary organic phosphor for absorbing a beta particle emitted by the tritiated organic polymer and emitting photons at a first frequency bandwidth and a secondary organic phosphor for shifting the frequency bandwidth of the photons emitted by the primary organic phosphor to establish the specified frequency banwidth for the light energy emitted by the light emitting polymer material.

4. The electrical energy source of claim 3 wherein the primary organic phosphor consists of a phosphor from the group PPO, PBD, and POPOP.

5. The electrical energy source of claim 1 wherein the number of curies of the radioisotope present in the light emitting polymer material is less than 100 curies/gram.

6. The electrical energy source of claim 1 wherein the half-life of the radioisotope activating the light emitting polymer material is approximately the same as the average desired lifetime of the electrical energy source.

7. The electrical energy source of claim 1 wherein the photovoltaic cell has a maximum absorption value at a specified frequency bandwidth that is matched to the specified frequency bandwidth of the emitted light energy of the light emitting polymer material.

8. The electrical energy source of claim 1 wherein the specified frequency bandwidth of the emitted light energy of the light emitting polymer is substantially monochromatic.

9. The electrical energy source of claim 1 wherein the light emitting surface of the light emitting polymer material and the light collecting surface of the photovoltaic cell are generally parallel to one another.

10. The electrical energy source of claim 1 wherein the light emitting surface of the light emitting polymer material and the light collecting surface of the photovoltaic cell are generally planar.

11. The electrical energy source of claim 1 wherein the total energy produced by the electrical energy source is less than 200 milliwatts.

12. The electrical energy source of claim 1 wherein the average useful life of the electrical energy source is at least 10 years.

13. The electrical energy source of claim 1 wherein at least 75% of the light emitting surface is in optical contact with the light collecting surface.

14. The electrical energy source of claim 1 further including means for optically coupling the light emitting surface of the light emitting polymer material with the light collecting surface of the photovoltaic cell.

15. The electrical energy source of claim 14 wherein the means for optically coupling the light emitting surface and the light collecting surface comprises an antireflective coating, the index of refraction of which is substantially equal to the square root of the product of the index of refraction of the light emitting polymer material and the index of refraction of the photovoltaic cell.

16. The electrical energy source of claim 15 wherein the means for optically coupling the light emitting surface and the light collecting surface is a contact gel.

17. The electrical energy source of claim 1 further comprising concentrating means operably interposed between the light emitting surface of the light emitting polymer material and the light collecting surface of the photovoltaic cell for concentrating the emitted light energy that is received by the photovoltaic cell.

18. The electrical energy source of claim 1 further comprising a zener diode electrically connected between the pair of electrical contacts.

19. The electrical energy source of claim 1 further comprising a capacitor electrically connected between the pair of electrical contacts.

20. The electrical energy source of claim 1 wherein the light emitting polymer material emits light energy from both a first and second light emitting surface.

21. The electrical energy source of claim 20 further comprising a second photovoltaic cell having a second light collecting surface and a second pair of electrical contacts, the second light collecting surface of the second photovoltaic cell being optically coupled to the second light emitting surface of the light emitting polymer material.

22. The electrical energy source of claim 21 wherein the first and second pair of electrical contacts are arranged in parallel electrical connection.

23. The electrical energy source of claim 21 wherein the first and second pair of electrical contacts are arranged in series electrical connection.

24. The electrical energy source of claim 1 wherein the light emitting polymer material and the photovoltaic cell are both planar and coiled together to form a spiral structure having the light emitting surface of the light emitting polymer material operably adjacent the light collecting surface of the photovoltaic cell.

25. The electrical energy source of claim 1 wherein the light emitting polymer material and the photovoltaic cell are concentric spheres having the light emitting surface of the light emitting polymer material operably adjacent the light collecting surface of the photovoltaic cell.

26. An electrical energy source comprising:
a plurality of planar sheets of light emitting polymer material that each emit light energy in a specified frequency bandwidth from each of a first and second planar surfaces of each sheet, the light emitting polymer material comprising an organic polymer incorporating a radioisotope emitting beta particles to which an organic phosphor is bonded, wherein the radioisotope consists of a radioisotope selected from the group $^{3}H$, $^{10}Be$, $^{14}C$, $^{32}Si$ and $^{32}P$; and
a plurality of planar sheets of photovoltaic laminate, including in successive planar orientation:
a first layer of semiconducting material;
a first layer of conductive substrate;
a layer of dielectric material
a second layer of semiconducting material; and
a second layer of conductive substrate,
and further including:
a first pair of electrical contacts operably connected to the first layer of conductive substrate; and
a second pair of electrical contacts operably connected to the first layer of conductive substrate,
the sheets of light emitting polymer material and the sheets of photovoltaic laminate being alternately arranged together to form a layered planar structure with at least a portion of the first light emitting surface of one of the sheets of light emitting polymer material optically coupled to the first layer of semiconducting material of a first sheet of photovoltaic laminate and at least a portion of the second light emitting surface of the same sheet of light emitting polymer material optically coupled to the second layer of semiconducting material of a second sheet of photovoltaic laminate,
such that an open-circuit voltage is generated between the both the first and the second pair of electrical contacts as a result of the absorption of emitted light energy from the sheet of light emitting polymer material by the first and second sheets of photovoltaic laminate.

27. The electrical energy source of claim 26 wherein the first and second pair of electrical contacts are arranged in parallel electrical connection.

28. The electrical energy source of claim 26 wherein the first and second pair of electrical contacts are arranged in series electrical connection.

29. An electrical energy source comprising:
a light emitting polymer material that emits light energy in a specified frequency bandwidth from each of a first and second planar surfaces of the light emitting polymer material, the light emitting polymer material comprising an organic polymer incorporating a radioisotope emitting beta particles to which an organic phosphor is bonded, wherein the radioisotope consists of a radioisotope selected from the group $^{3}H$, $^{10}Be$, $^{14}C$, $^{32}Si$ and $^{32}P$; and
a planar photovoltaic laminate, including in successive planar orientation:
a first layer of semiconducting material;
a first layer of conductive substrate;
a layer of dielectric material
a second layer of semiconducting material; and
a second layer of conductive substrate,
and further including:
a first pair of electrical contacts operably connected to the first layer of conductive substrate; and
a second pair of electrical contacts operably connected to the first layer of conductive substrate,
the light emitting polymer material and the photovoltaic laminate being coiled together to form a spiraled cylindrical structure with at least a portion of the first light emitting surface of the light emitting polymer material optically coupled to the first layer of semiconducting material and at least a portion of the second light emitting surface of the light emitting polymer material optically coupled to the second layer of semiconducting material of the photovoltaic laminate,
such that an open-circuit voltage is generated between the both the first and the second pair of electrical contacts as a result of the absorption of emitted light energy from the light emitting polymer material by the photovoltaic laminate.

30. The electrical energy source of claim 29 wherein the first and second pair of electrical contacts are arranged in parallel electrical connection.

31. The electrical energy source of claim 29 wherein the first and second pair of electrical contacts are arranged in series electrical connection.

32. The electrical energy source of claim 26 wherein the light emitting polymer material is comprised of a tritiated organic polymer to which an organic phosphor is bonded.

33. The electrical energy source of claim 26 wherein the photovoltaic laminate has a maximum absorption value at a specified frequency bandwidth that is matched to the specified frequency bandwidth of the emitted light energy of the light emitting polymer material.

34. The electrical energy source of claim 33 wherein the specified frequency bandwidth of the emitted light energy of the light emitting polymer is substantially monochromatic.

35. The electrical energy source of claim 29 wherein the light emitting polymer material is comprised of a tritiated organic polymer to which an organic phosphor is bonded.

36. The electrical energy source of claim 29 wherein the photovoltaic laminate has a maximum absorption value at a specified frequency bandwidth that is matched to the specified frequency bandwidth of the emitted light energy of the light emitting polymer material.

37. The electrical energy source of claim 29 wherein the specified frequency bandwidth of the emitted light energy of the light emitting polymer is substantially monochromatic.

38. An active electrical element, comprising:
a light emitting polymer material having at least one light emitting surface emitting light energy in a specified frequency bandwidth, the light emitting polymer material comprising an organic polymer incorporating a radioisotope emitting beta particles to which an organic phosphor is bonded, wherein the radioisotope consists of a radioisotope selected from the group $^3H$, $^{10}Be$, $^{14}C$, $^{32}Si$ and $^{32}P$;
a photovoltaic cell having a light collecting surface and a pair of electrical contacts, the light collecting surface of the photovoltaic cell being optically coupled to the light emitting surface of the light emitting polymer; and
optical control means intimately interposed between the light emitting surface of the light emitting polymer material and the light collecting surface of the photovoltaic cell for controlling the amount of emitted light energy that may be absorbed by the photovoltaic cell,
such that an open-circuit voltage is generated between the pair of electrical contacts as a result of the photovoltaic cell's absorption of light energy emitted from the light emitting polymer when the optical control means allows at least a minimum amount of the emitted light energy to be absorbed by the photovoltaic cell.

39. The electrical energy source of claim 38 wherein the optical control means is a liquid crystal display material.

40. The electrical energy source of claim 38 wherein the optical control means is a lead lantium zirconium titinate material.

41. The electrical energy source of claim 38 wherein the light emitting polymer material is comprised of a tritiated organic polymer to which an organic phosphor is bonded.

42. The electrical energy source of claim 38 wherein the photovoltaic cell has a maximum absorption value at a specified frequency bandwidth that is matched to the specified frequency bandwidth of the emitted light energy of the light emitting polymer material.

43. The electrical energy source of claim 42 wherein the specified frequency bandwidth of the emitted light energy of the light emitting polymer is substantially monochromatic.

* * * * *